(12) United States Patent
Cha et al.

(10) Patent No.: US 11,281,259 B2
(45) Date of Patent: Mar. 22, 2022

(54) MOBILE TERMINAL

(71) Applicant: LG ELECTRONICS INC., Seoul (KR)

(72) Inventors: Youngdo Cha, Seoul (KR); Minbok Lee, Seoul (KR); Jinwoo Park, Seoul (KR); Sunglyong Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/043,987

(22) PCT Filed: May 11, 2018

(86) PCT No.: PCT/KR2018/005456
§ 371 (c)(1),
(2) Date: Sep. 30, 2020

(87) PCT Pub. No.: WO2019/216467
PCT Pub. Date: Nov. 14, 2019

(65) Prior Publication Data
US 2021/0034114 A1 Feb. 4, 2021

(51) Int. Cl.
*G06F 1/16* (2006.01)
*H05K 5/00* (2006.01)
*H05K 5/02* (2006.01)

(52) U.S. Cl.
CPC ......... *G06F 1/1656* (2013.01); *H05K 5/0086* (2013.01); *H05K 5/0213* (2013.01)

(58) Field of Classification Search
CPC .................................................... G06F 1/1656
See application file for complete search history.

(56) References Cited

U.S. PATENT DOCUMENTS

| 7,838,784 | B2* | 11/2010 | Arisaka | G06F 1/1616 200/302.1 |
|---|---|---|---|---|
| 7,941,196 | B2* | 5/2011 | Kawasaki | H04M 1/18 455/575.8 |
| 8,068,331 | B2* | 11/2011 | Sauers | G06F 1/1656 361/679.01 |
| 8,160,657 | B2* | 4/2012 | Perriello | H04M 1/23 455/575.1 |
| 8,482,305 | B2* | 7/2013 | Johnson | G01M 3/045 324/694 |

(Continued)

FOREIGN PATENT DOCUMENTS

| JP | 2003-347756 A | 12/2003 |
|---|---|---|
| KR | 10-2013-0025769 A | 3/2013 |

(Continued)

*Primary Examiner* — Adrian S Wilson
(74) *Attorney, Agent, or Firm* — Birch, Stewart, Kolasch & Birch, LLP

(57) ABSTRACT

The present invention relates to a mobile terminal comprising: a front case having a display mounted on the front part thereof; a rear case coupled to one side of the front case and coupled to the rear part of same; a main circuit board provided between the front case and the rear case; and a fluid movement port having a groove, of a predetermined depth, formed to be adjacent to the edge of the front part of the front case and extend in one direction, wherein the fluid movement port can guide the movement of fluid which enters through gaps between the display and the front case.

11 Claims, 9 Drawing Sheets

(56) References Cited

U.S. PATENT DOCUMENTS

| | | | | |
|---|---|---|---|---|
| 8,830,662 | B2* | 9/2014 | Myers | H05K 5/0213 |
| | | | | 361/679.01 |
| 9,380,723 | B2* | 6/2016 | Rayner | H05K 5/06 |
| 9,872,408 | B2* | 1/2018 | Choi | H04M 1/18 |
| 9,972,934 | B1* | 5/2018 | Taylor | A45C 11/00 |
| 10,257,333 | B2* | 4/2019 | Kim | G06F 3/03548 |
| 10,588,224 | B2* | 3/2020 | Hou | H05K 5/0217 |
| 2013/0242481 | A1* | 9/2013 | Kim | H04B 1/3888 |
| | | | | 361/679.01 |
| 2014/0131184 | A1* | 5/2014 | Xiao | G06F 1/203 |
| | | | | 200/302.1 |
| 2015/0114090 | A1* | 4/2015 | Fukuda | F21V 33/0052 |
| | | | | 73/40 |
| 2017/0154742 | A1* | 6/2017 | Hisano | H01R 12/592 |
| 2019/0008058 | A1* | 1/2019 | Hou | G06F 1/1656 |
| 2020/0187376 | A1* | 6/2020 | Jun | G07F 7/1033 |
| 2021/0100122 | A1* | 4/2021 | Wang | H04B 1/3888 |

FOREIGN PATENT DOCUMENTS

| KR | 10-2013-0090546 A | 8/2013 |
|---|---|---|
| KR | 10-2015-0049292 A | 5/2015 |
| KR | 10-2017-0123904 A | 11/2017 |

* cited by examiner

MOBILE TERMINAL

CROSS-REFERENCE TO RELATED APPLICATIONS

This application is the National Phase of PCT International Application No. PCT/KR2018/005456, filed on May 11, 2018, which is hereby expressly incorporated by reference into the present application.

BACKGROUND

1. Technical Field

The present disclosure relates to a structure of a mobile terminal capable of inducing the movement of fluid flowing into the mobile terminal and discharging the fluid to an outside thereof.

2. Description of the Related Art

Terminals may be classified into mobile/portable terminals and stationary terminals according to their mobility. Furthermore, mobile terminals may be divided into handheld terminals and vehicle mounted terminals according to whether or not it can be directly carried by a user.

The terminal has various functions according to the development of technologies. The terminal may be implemented in the form of a multimedia player with various functions such capturing pictures or videos, playing music or video files, playing games, receiving broadcast, and the like, and the improvement of structural or software elements of the terminal may be taken into consideration in order to support and enhance the functions of the terminal.

In recent years, a design of the terminal has gradually become simpler and a thickness thereof has been gradually reduced to have a structure in which electronic components are arranged in close contact with an inside thereof, and when fluid flows into the terminal, it may affect the electronic components or the like, thereby resulting in deterioration of performance and reliability. Accordingly, it may be required to block fluid from flowing into the terminal in various environments in which the terminal is used.

When a high waterproof specification is applied to a mobile terminal to implement such waterproof performance, there is a problem in that the manufacturing cost of the mobile terminal increases. Accordingly, it may be required to move fluid flowing into the mobile terminal along a predetermined path without adding any additional member, and discharge it out of the mobile terminal, thereby preventing effect on the terminal.

SUMMARY

An aspect of the present disclosure is to solve the foregoing and other problems, and provide a structure of a mobile terminal capable of guiding fluid flowing into a mobile terminal to move in a predetermined direction.

Furthermore, the present disclosure is to provide a structure of a mobile terminal capable of collecting fluid flowing into the terminal or discharging it out therefrom, thereby preventing effect on components located inside the terminal.

In addition, the present disclosure is to provide a structure of a mobile terminal capable of increasing a cross-sectional area in which fluid moving along a fluid movement port is brought into contact with the fluid movement port to disperse and evaporate the fluid.

In order to achieve the foregoing objectives of the present disclosure, a mobile terminal according to an embodiment of the present disclosure may include a front case on which a display is mounted on a front side thereof; a rear case coupled to a rear portion of the front case; a main circuit board provided between the front case and the rear case; and a fluid movement port in which a groove having a predetermined depth extends in one direction is disposed adjacent to a front edge of the front case, wherein the fluid movement port guides the movement of fluid flowing into a gap between the display and the front case.

According to an embodiment of the present disclosure, the fluid movement port may include a first fluid movement port disposed at a position spaced apart from a front side end edge of the front case by a predetermined distance; and a second fluid movement port disposed at a position spaced apart from a front upper edge of the front case by a predetermined distance.

Here, a coating member made of a polymer material may be configured to cover a surface of each of the fluid movement ports, thereby efficiently moving fluid along the surface of the fluid movement ports.

According to an embodiment of the present disclosure, the first fluid movement port may include a first passage disposed adjacent to a side edge of the front case to guide the movement of fluid flowing in from a side portion of the front case; and a first fluid receiving portion disposed at a lower end portion of the first passage and defined in a groove shape having a predetermined depth on a front surface of the front case to receive fluid moving along the first passage.

According to an embodiment of the present disclosure, the first passage may include an extension portion configured to extend in an up-down direction along a surface of the front case so as to guide the movement of the fluid.

According to an embodiment of the present disclosure, a bent portion may be disposed at one side of the extension portion so as to be bent at a predetermined angle and shape.

According to an embodiment of the present disclosure, the bent portions may be disposed at a plurality of positions along the extension portion to increase a movement path of fluid.

According to an embodiment of the present disclosure, a fluid discharge pipe connected to the extension portion may be disposed at a lower end portion of the front case, and the fluid discharge pipe may guide the discharge of fluid moving along the extension portion.

According to an embodiment of the present disclosure, the second fluid movement port may include a second passage disposed adjacent to an upper edge of the front case to guide the movement of fluid flowing in from an upper portion of the front case; and a second fluid receiving portion defined in a groove shape having a predetermined depth on a surface of the front case to receive fluid moving along the second passage.

According to an embodiment of the present disclosure, the second fluid receiving portion may be radially disposed on a front upper surface of the front case.

According to an embodiment of the present disclosure, an air vent hole disposed adjacent to a camera module to allow air to flow in and out so as to maintain pressure inside the mobile terminal may be provided at a rear portion of the front case, and a decor plate configured to cover the camera module and the air vent hole may be further provided, and a third fluid movement port may extend in an up-down direction at a position overlapping with the air vent hole to guide the movement of fluid flowing in between the camera module and the decor plate.

According to an embodiment of the present disclosure, an absorbent member may be provided at one end portion of the third fluid movement port to absorb fluid moving along the third fluid movement port.

According to a mobile terminal having a structure as described above, fluid flowing in from upper and side portions of the mobile terminal may be guided by a fluid movement port disposed on a surface of a front case to guide the movement of fluid flowing into the mobile terminal.

Furthermore, fluid moving along the fluid movement port may be partially evaporated through contact with the fluid movement port, and may be partially received through the fluid receiving portion, and may be induced in a predetermined direction and then discharged to the outside. Through this, it may be possible to prevent deterioration of reliability from affecting the performance of electronic devices and circuit boards located inside the terminal.

In addition, according to the present disclosure, a plurality of bent portions may be arranged in the fluid movement port to increase a cross-sectional area of fluid moving along the fluid movement port in contact with the fluid movement port, thereby reducing the movement speed of the fluid.

DETAILED DESCRIPTION OF THE EMBODIMENTS

Figure 1A:
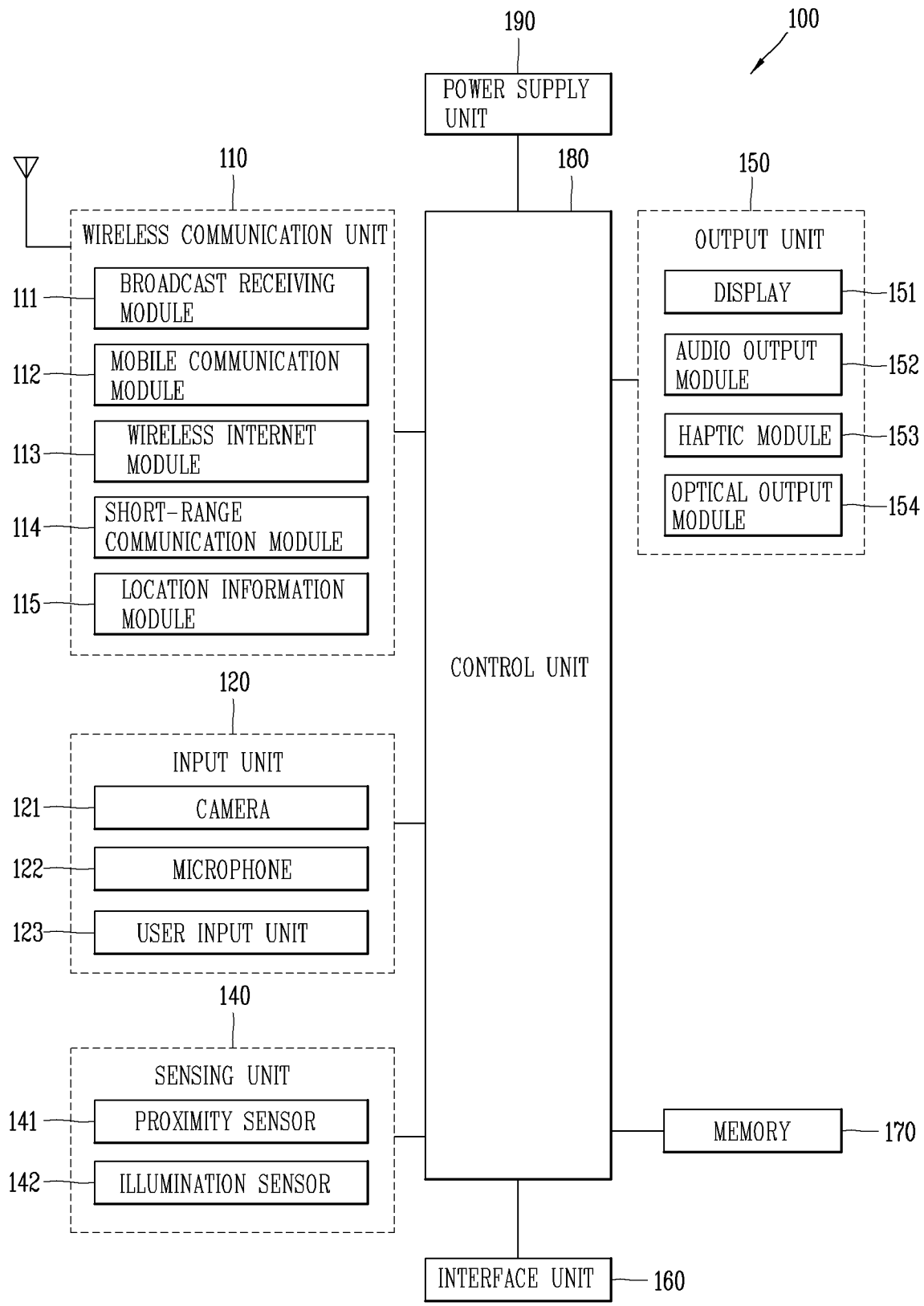
FIG. 1A is a block diagram for explaining a mobile terminal according to the present disclosure.

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, moreover, the detailed description will be omitted when a specific description for publicly known technologies to which the invention pertains is judged to obscure the gist of the present disclosure. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are used only for the purpose of distinguishing one element from another element. It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context. Terms "include" or "has" used herein should be understood that they are intended to indicate the existence of a feature, a number, a step, a constituent element, a component or a combination thereof disclosed in the specification, and it may also be understood that the existence or additional possibility of one or more other features, numbers, steps, constituent elements, components or combinations thereof are not excluded in advance.

FIG. 1A is a block diagram for explaining a mobile terminal 100 associated with the present disclosure.

The mobile terminal 100 may include a wireless communication unit 110, an input unit 120, a sensing unit 140, an output unit 150, an interface unit 160, a memory 170, a controller 180, a power supply unit 190, and the like. FIG. 1 illustrates the mobile terminal 100 having various components, but it may be understood that implementing all of the illustrated components is not a requirement. Greater or fewer components may alternatively be implemented.

In more detail, the wireless communication unit 110 of those components may typically include one or more modules allowing wireless communications between the mobile terminal 100 and a wireless communication system, between the mobile terminal 100 and another mobile terminal, or between the mobile terminal 100 and an external server. In addition, the wireless communication unit 110 may include one or more modules for connecting the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 is typically implemented using one or more sensors configured to sense internal information of the mobile terminal 100, the surrounding environment of the mobile terminal 100, user information, and the like. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). On the other hand, the mobile terminal disclosed herein may utilize information in such a manner of combining information sensed by at least two sensors of those sensors.

The output unit 150 may be configured to output an audio signal, a video signal or a tactile signal. The output unit 150 may include a display unit 151, an audio output module 152, a haptic module 153, an optical output unit 154 and the like. The display unit 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 serves as an interface with various types of external devices that can be coupled to the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user by processing signals, data, information and the like, which are input or output by the various components depicted in FIG. 1A, or activating application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement the operation and control of the mobile terminal 100 or a control method of the mobile terminal according to various exemplary embodiments described herein. Furthermore, the operation and control or the control method of the mobile terminal 100 may be implemented in the mobile terminal in such a manner of activating at least one application program stored in the memory 170.

Hereinafter, each aforementioned component will be described in more detail with reference to FIG. 1, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the mobile terminal 100 to simultaneously receive at least two broadcast channels or switch the broadcast channels.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal, or between the mobile terminal 100 and a network where another mobile terminal (or an external server) is located, via a wireless personal area network. The short-range communication module 114 denotes a module for short-range communications.

Here, the another mobile terminal may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal 100), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is a module for acquiring the location of the mobile terminal 100, and as a representative example, there are a Global Position System (GPS) module or a WiFi (Wireless Fidelity) module. For example, when the mobile terminal 100 uses the GPS module, a position of the mobile terminal 100 may be acquired using a signal sent from a GPS satellite. As another example, when the mobile terminal 100 uses the Wi-Fi module, a position of the mobile terminal 100 may be acquired based on information related to a wireless access point (AP) which transmits or receives a wireless signal to or from the Wi-Fi module. According to the need, the location information module 115 may perform any function of the other modules of the wireless communication unit 110 to obtain data on the location of the mobile terminal 100. As a module used to acquire the location (or current location) of the mobile terminal 100, the location information module 115 may not be necessarily limited to a module for directly calculating or acquiring the location of the mobile terminal 100.

The input unit 120 may be configured to provide an audio or video signal (or information) input to the electronic device or information input by a user to the electronic device. For the input of the audio information, the mobile terminal 100 may include one or a plurality of cameras 121. The camera 121 processes an image frame, such as still picture or video, acquired by an image sensor in a video phone call or image capturing mode. The processed image frames may be displayed on the display unit 151. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include a mechanical input element (or a mechanical key, for example, a button, a dome switch, a jog wheel, a jog switch or the like located on a front/rear surface or a side surface of the mobile terminal 100), and a touch-sensitive input element. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal 100, surrounding environment information of the terminal and user information, and generate a sensing signal corresponding to it. The controller 180 may control an operation of the mobile terminal 100 or execute data processing, a function or an operation associated with an application program installed in the mobile terminal 100 based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal 100 covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. The touch sensor may be configured to detect a position, an area where a touch object applying a touch onto the touch screen is touched on the touch sensor, a pressure at the time of touch, a capacitance at the time of touch, and the like. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the electronic device 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swype touch, a hovering touch, and the like.

An ultrasonic sensor may be configured to recognize position information relating to a sensing object by using ultrasonic waves. Meanwhile, the controller 180 may calculate the location of a wave generating source through information sensed from the optical sensor and the plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The camera 121 and the laser sensor may be combined to detect a touch of the sensing object with respect to a 3D stereoscopic image. More specifically, the photo sensor is integrated with photo diodes and transistors in the rows and columns thereof, and a content placed on the photo sensor may be scanned by using an electrical signal that is changed according to the amount of light applied to the photo diode. Namely, the photo sensor may calculate the coordinates of the sensing object according to variation of light to thus obtain position information of the sensing object.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

Furthermore, the display unit 151 may also be implemented as a stereoscopic display unit for displaying stereoscopic images.

The stereoscopic display unit may employ a stereoscopic display scheme such as stereoscopic scheme (a glass scheme), an auto-stereoscopic scheme (glassless scheme), a projection scheme (holographic scheme), or the like.

The audio output unit 152 may output audio data received from the wireless communication unit 110 or stored in the memory 160 in a call signal reception mode, a call mode, a record mode, a voice recognition mode, a broadcast reception mode, and the like. Also, the audio output unit 152 may also provide audible output signals related to a particular function (e.g., a call signal reception sound, a message reception sound, etc.) performed by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. The haptic module 153 may be implemented in two or more in number according to the configuration of the electronic device 100.

An optical output module 154 may output a signal for indicating an event generation using light of a light source. Examples of events generated in the electronic device 100 may include a message reception, a call signal reception, a missed call, an alarm, a schedule notice, an email reception, an information reception through an application, and the like.

A signal output by the optical output module 154 may be implemented in such a manner that the electronic device emits monochromatic light or light with a plurality of colors. The signal output may be terminated as the electronic device senses that a user has checked the generated event, for example.

The interface unit 160 serves as an interface for external devices to be connected with the electronic device 100. The interface unit 160 may allow a data reception from an external device, a power delivery to each component in the electronic device 100, or a data transmission from the electronic device 100 to an external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

On the other hand, the identification module may be configured as a chip for storing various information required to authenticate an authority to use the mobile terminal 100, which may include a User Identity Module (UIM), a Subscriber Identity Module (SIM), and the like. A device having the identification module (hereinafter, an "identification device") may be fabricated in the form of a smart card. Accordingly, the identifying device may be connected with the electronic device 100 via the interface unit 160.

The interface unit 160 may serve as a path for power to be supplied from an external cradle to the electronic device 100 when the electronic device 100 is connected to the external cradle or as a path for transferring various command signals inputted from the cradle by a user to the electronic device 100. Such various command signals or power inputted from the cradle may operate as signals for recognizing that the electronic device 100 has accurately been mounted to the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the electronic device 100 may operate in association with a web storage which performs the storage function of the memory 170 on the Internet.

As aforementioned, the controller 180 may typically control the general operations of the electronic device 100. For example, the controller 180 may set or release a locked state a lock state for restricting a user from inputting a control command with respect to applications when a state of the electronic device 100 meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the electronic device 100.

The power supply unit 190 may receive external power or internal power and supply appropriate power required for operating respective elements and components under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

On the other hand, various embodiments described herein may be implemented in a computer-readable or its similar medium using, for example, software, hardware, or any combination thereof.

Hereinafter, a structure of the mobile terminal 100 according to an embodiment of the present disclosure as described above in FIG. 1A or the terminal disposed with the foregoing components will be described with reference to FIGS. 1B and 1C.

Figure 1B:
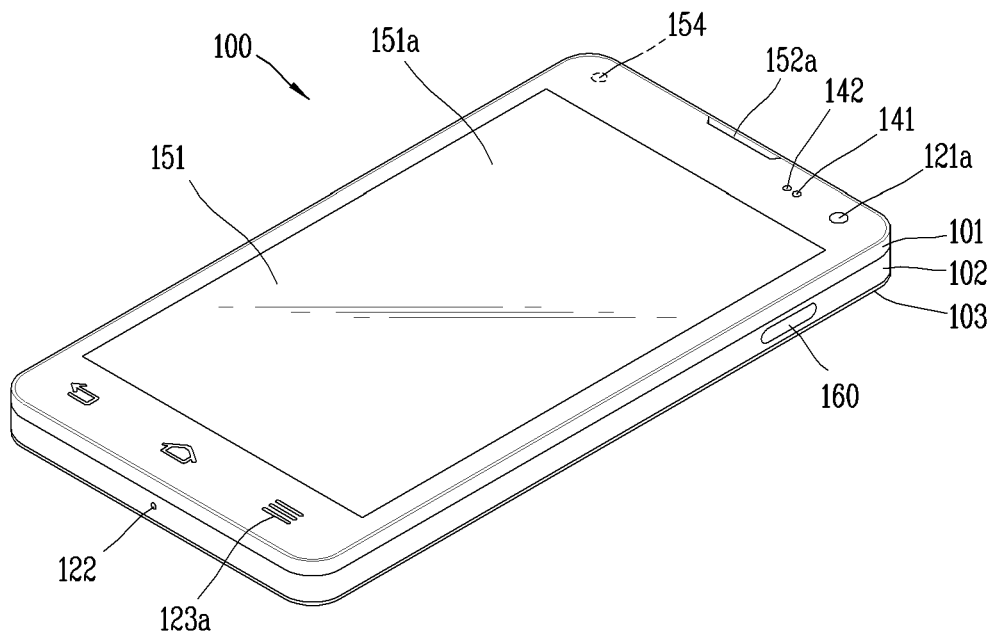
FIG. 1B is a perspective view in which a front portion of the mobile terminal is seen from the outside.
Figure 1C:
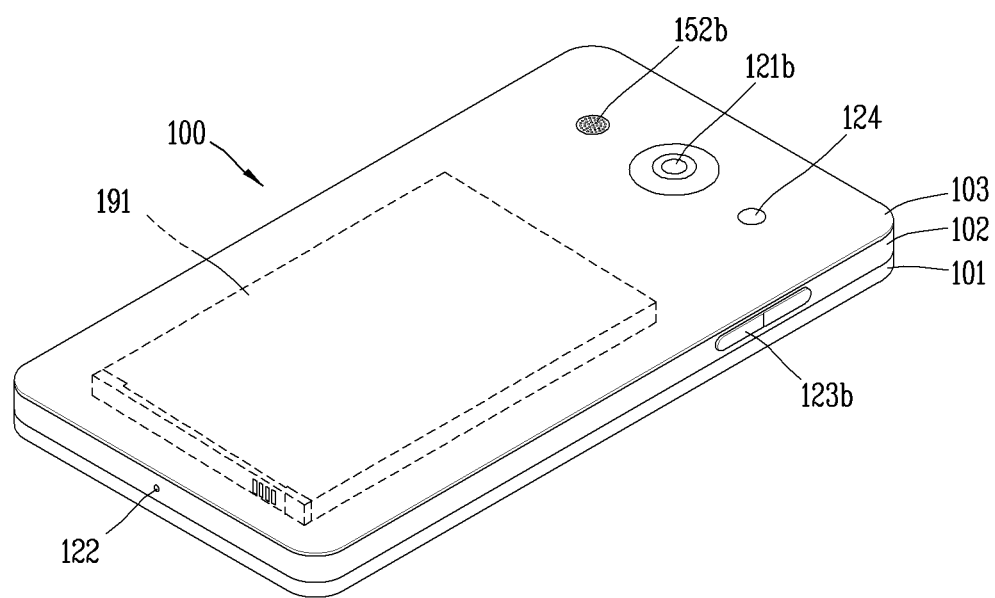
FIG. 1C is a perspective view in which a rear portion of the mobile terminal is seen from the outside.

Referring to FIGS. 1B and 1C, the mobile terminal 100 disclosed herein is provided with a bar-type terminal body. However, the present disclosure may not be necessarily limited to this, and may be also applicable to various structures such as a watch type, a clip type, a glasses type, a folder type in which two or more bodies are coupled to each other in a relatively movable manner, a slide type, a swing type, a swivel type, and the like. The following description in association with a specific type of mobile terminal or on a specific type of mobile terminal will be also typically applied to another type of mobile terminal.

Here, the terminal body may be understood as a conception which indicates the mobile terminal 100 as at least one assembly.

The mobile terminal 100 may include a case (for example, a frame, a housing, a cover, etc.) constituting the appearance thereof. As illustrated in the drawing, the mobile terminal 100 may include a front case 101 and a rear case 102. Various electronic components may be incorporated into a space formed between the front case 101 and the rear case 102. At least one middle case may be additionally disposed between the front case 101 and the rear case 102

A display unit 151 may be disposed on a front surface of the terminal body to output information. As illustrated, a window 151a of the display unit 151 may be mounted to the front case 101 so as to form the front surface of the terminal body together with the front case 101.

In some cases, electronic components may also be mounted to the rear case 102. Examples of those electronic components mounted to the rear case 102 may include a detachable battery, an identification module, a memory card and the like. Here, a rear cover 103 for covering the electronic components mounted may be detachably coupled to the rear case 102. Therefore, when the rear cover 103 is detached from the rear case 102, the electronic components mounted to the rear case 102 may be externally exposed.

As illustrated, when the back cover 103 is coupled to the rear case 102, a side surface of the rear case 102 may be partially exposed. In some cases, upon the coupling, the rear case 102 may also be completely shielded by the rear cover 300. On the other hand, the back cover 103 may include an opening portion for exposing the camera 121b or the audio output module 152b to the outside.

The cases 101, 102, 103 may be formed by injection-molding synthetic resin or may be formed of a metal, for example, stainless steel (STS), aluminum (Al), titanium (Ti), or the like.

Unlike the example which the plurality of cases form an inner space for accommodating such various components, the mobile terminal 100 may be configured such that one case forms the inner space. In this example, the mobile terminal 100 having a uni-body formed in such a manner that synthetic resin or metal extends from a side surface to a rear surface may also be implemented.

On the other hand, the mobile terminal 100 may include a waterproof portion (not shown) for preventing water from infiltrating into the terminal body. For example, the waterproof portion may include a waterproof member provided between the window 151a and the front case 101, between the front case 101 and the rear case 102, or between the rear case 102 and the back cover 103, to hermetically seal an inner space when those cases are coupled to each other.

The mobile terminal 100 may include a display unit 151, first and second audio output modules 152a and 152b, a proximity sensor 141, an illumination sensor 152, an optical output module 154, first and second cameras 121a and 121b, first and second manipulation units 123a and 123b, a microphone 122, an interface unit 160 and the like.

Hereinafter, description will be given of an exemplary mobile terminal 100 that the display unit 151, the first audio output module 152a, the proximity sensor 141, the illumination sensor 142, the optical output module 154, the first camera 121a and the first manipulation unit 123a are disposed on the front surface of the terminal body, the second manipulation unit 123b, the microphone 122 and the interface unit 160 are disposed on a side surface of the terminal body, and the second audio output module 152b and the second camera 121b are disposed on a rear surface of the terminal body, with reference to FIGS. 1B and 1C.

However, the foregoing configuration may not be necessarily limited to the arrangement. The foregoing configuration may be excluded, substituted or disposed on another surface if necessary. For example, the first manipulation unit 123a may not be disposed on the front surface of the terminal body, and the second audio output module 152b may be disposed on the side surface other than the rear surface of the terminal body.

The display unit 151 may display (output) information processed in the mobile terminal 100. For example, the display unit 151 may display execution screen information of an application program driven in the mobile terminal 100 or user interface (UI) and graphic user interface (GUI) information in response to the execution screen information.

The display unit 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented in two or more in number according to a configured aspect of the mobile terminal 100. In this case, a plurality of the display units 151 may be arranged on one surface to be spaced apart from or integrated with each other, or may be arranged on different surfaces in the mobile terminal 100.

The display unit 151 may include a touch sensor which senses a touch onto the display unit so as to receive a control command in a touching manner. When a touch is input to the display unit 151, the touch sensor may be configured to sense this touch and the controller 180 may generate a control command corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

In this manner, the display unit 151 may form a flexible touch screen along with the touch sensor, and in this case, the touch screen may function as the user input unit 123 (refer to FIG. 1A). Therefore, the touch screen may replace at least some of the functions of the first manipulation unit 123a. Hereinafter, for convenience of explanation, the display unit (display module) for outputting the image and the touch sensor are collectively referred to as a touch screen 151.

The first audio output module 152a may be implemented in the form of a receiver for transferring voice sounds to the user's ear or a loud speaker for outputting various alarm sounds or multimedia reproduction sounds.

The window 151a of the display unit 151 may include a sound hole for emitting sounds generated from the first audio output module 152a. Here, the present disclosure may not be limited to this. It may also be configured such that the sounds are released along an assembly gap between the structural bodies (for example, a gap between the window 151a and the front case 101). In this case, a hole independently formed to output audio sounds may not be seen or hidden in terms of appearance, thereby further simplifying the appearance of the mobile terminal 100.

The optical output module 154 may output light for indicating an event generation. Examples of the event may include a message reception, a call signal reception, a missed call, an alarm, a schedule notice, an email reception, information reception through an application, and the like. When a user's event check is sensed, the controller 180 may control the optical output unit 154 to end the output of light.

The first camera 121a may process video frames such as still or moving images acquired by the image sensor in a video call mode or a capture mode. The processed video frames may be displayed on the display unit 151 or stored in the memory 170.

The first and second manipulation units 123a and 123b are examples of the user input unit 123, which may be manipulated by a user to input a command for controlling the operation of the mobile terminal 100. The first and second manipulation units 123a and 123b may employ any method if it is a tactile manner allowing the user to perform manipulation with a tactile feeling such as touch, push, scroll or the like. In addition, the first and second manipulation units 123a and 123b may also employ a method of allowing the user to perform manipulation without a tactile feeling through a proximity touch, a hovering touch, or the like.

The drawings are illustrated on the basis that the first manipulation unit 123a is a touch key, but the present disclosure may not be necessarily limited to this. For example, the first manipulation unit 123a may be configured with a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

On the other hand, as another example of the user input unit 123, a rear input unit (not shown) may be disposed on the rear surface of the terminal body. The rear input unit may be manipulated by a user to input a command for controlling an operation of the mobile terminal 100. The content input may be set in various ways. For example, the rear input unit may be used by the user to input a command, such as power on/off, start, end, scroll or the like, controlling a volume level being output from the first or second audio output module 152a or 152b, switching into a touch recognition mode of the display unit 151, or the like. The rear input unit may be implemented into a form allowing a touch input, a push input or a combination thereof.

The rear input unit may be disposed to overlap with the display unit 151 of the front surface in a thickness direction of the terminal body. As one example, the rear input unit may be disposed on an upper end portion of the rear surface of the terminal body such that a user can easily manipulate it using a forefinger when the user grabs the terminal body with one hand. However, the present disclosure may not be limited to this, and the position of the rear input unit may be changeable.

When the rear input unit is disposed on the rear surface of the terminal body, a new user interface may be implemented using the rear input unit. Also, the aforementioned touch screen or the rear input unit may substitute for at least part of functions of the first manipulation unit 123a located on the front surface of the terminal body. Accordingly, when the first manipulation unit 123a is not disposed on the front surface of the terminal body, the display unit 151 may be implemented to have a larger screen.

On the other hand, the mobile terminal 100 may include a fingerprint recognition sensor for recognizing a user's fingerprint, and the controller 180 may use fingerprint information sensed through the finger recognition sensor as an authentication means. The finger recognition sensor may be integrated into the display unit 151 or the user input unit 123.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b may be further mounted to the rear surface of the terminal body. The second camera 121b may have an image capturing direction, which is substantially opposite to the direction of the first camera unit 121a.

The second camera 121b may include a plurality of lenses arranged along at least one line. The plurality of lenses may also be arranged in a matrix configuration. The cameras may be referred to as an 'array camera.' When the second camera 121b is implemented as the array camera, images may be captured in various manners using the plurality of lenses and images with better qualities may be obtained.

A flash 124 may be disposed adjacent to the second camera 121b. When an image of a subject is captured with the camera 121b, the flash 124 may illuminate the subject.

The second audio output module 152b may further be disposed on the terminal body. The second audio output module 152b may implement a stereo function in conjunction with the first audio output module 152a, and may be also used to implement a speakerphone mode during a call.

At least one antenna for wireless communication may be disposed on the terminal body. The antenna may be installed in the terminal body or formed on the case. For example, an antenna which configures a part of the broadcast receiving module 111 (see FIG. 1A) may be retractable into the terminal body. Alternatively, an antenna may be formed in a form of film to be attached onto an inner surface of the rear cover 300 or a case including a conductive material may serve as an antenna.

A power supply unit 190 (refer to FIG. 1A) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Furthermore, the battery 191 may be (re)chargeable in a wireless manner using a wireless charger. The wireless charging may be implemented by magnetic induction or electromagnetic resonance.

On the other hand, the drawing illustrates that the back cover 103 is coupled to the rear case 102 for shielding the battery 191, so as to prevent separation of the battery 191 and protect the battery 191 from an external impact or foreign materials. When the battery 191 is detachable from the terminal body, the rear case 300 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display unit 151 to extend the function of the mobile terminal 100. Another example of the accessory may be a touch pen for assisting or extending a touch input onto a touch screen.

Figure 2:
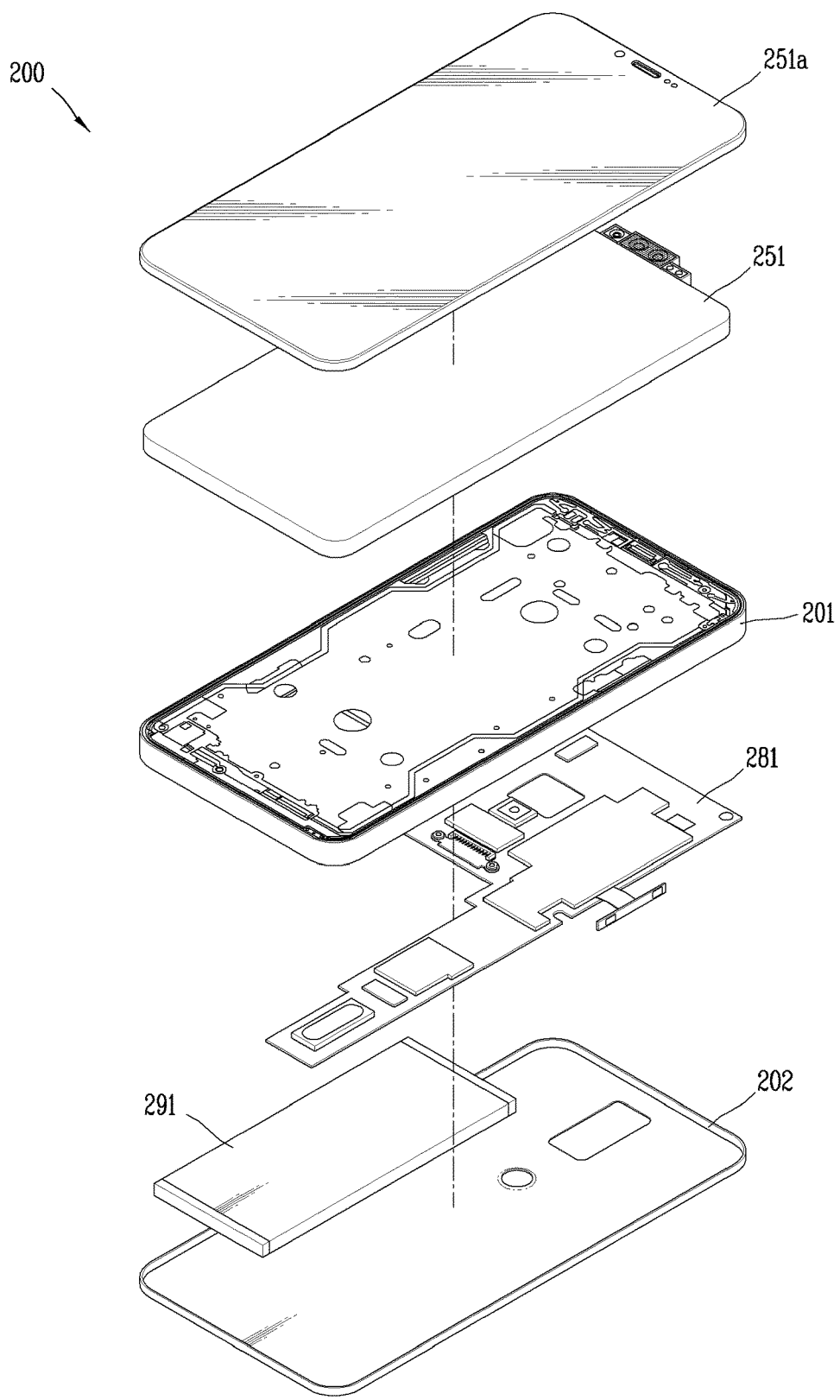
FIG. 2 is an exploded view showing a mobile terminal according to the present disclosure.

FIG. 2 shows an exploded view in which a mobile terminal 200 according to the present invention is disassembled.

The mobile terminal 200 according to the present disclosure has a structure internally including a front case 201 in which a display unit 251 is accommodated in a front portion thereof, and a rear case 202 provided on a rear surface of the front case 201 in the configuration. The front case 201 and the rear case 202 defines a predetermined space therein. The rear case 202 may be coupled to a rear portion of the front case 201 to define a rear appearance of the mobile terminal 200.

A storage space for mounting a battery 291 may be disposed at one side of the front case 201, and the rear case 201 may be mounted on the front case 201 so as to cover the battery 190.

The front case 201 may be configured to define an appearance of a side surface of the mobile terminal 200. Here, the side surface of the mobile terminal 200 denotes a surface connecting the front surface and the rear surface, and a side surface portion thereof may be made of a metal member. When the side member is made of a metal member, it may perform the role of a radiator of the antenna. In this case, a side case may be separately provided and coupled to a side surface of the front case 201, but the front case 201 and the side case may also be integrally formed.

A slit may be formed on a side surface of the front case 201, and the slit (not shown) may be an ear jack hole or a USB port. In this case, when current flows through the side surface of the front case 201, portions other than the side surface may be formed of a non-metallic member so as to block the flow of current.

A main circuit board 281 and a battery 291 may be located between the rear case 202 and the front case 201. The rear case 202 may have a through hole configured to install the battery 291.

The main circuit board 281 may have an approximately "E" or "C" shape. A plurality of electronic devices (not shown) including a drive chip (not shown) are disposed on the main circuit board 181.

The front case 201 may be provided with a display 251 including a display panel (not shown) and a window 251a on the front side. In addition, a receiver (not shown) for sound output may be provided on one upper side of the front case 201.

The front case 201 may operate as a ground (GND), and may be connected to ground the main circuit board 281 or the antenna.

The main circuit board 281 is electrically connected to the antenna and configured to process wireless signals (or wireless electromagnetic waves) transmitted and received by the antenna. In this case, a plurality of transceiver circuits may be formed or mounted on the main circuit board 181 for the processing of radio signals.

In the mobile terminal 200 according to the present disclosure, fluid movements ports 210, 220, 230 may be disposed on a front surface of the front case 201 to guide the movement of fluid flowing into the inside during the user's terminal use process to reduce the effect of fluid on the terminal, thereby securing waterproof performance as well as increasing reliability due to the quality improvement of the terminal.

Figure 3:
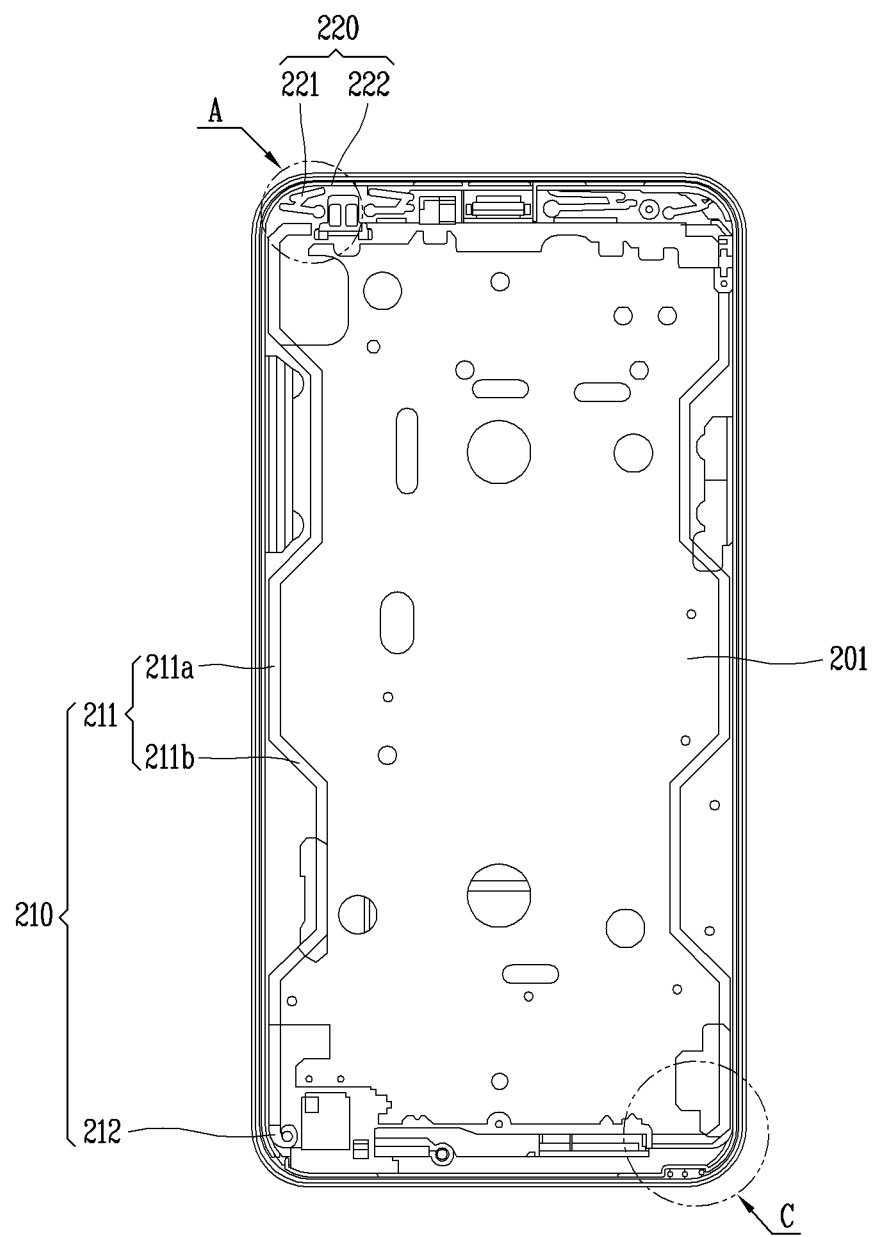
FIG. 3 is a plan view showing a front case included in a mobile terminal according to the present disclosure.

FIG. 3 is a plan view showing the shape of the front case 201 included in the mobile terminal 200 according to the present disclosure.

An electronic device (not shown) and a circuit board 281 inside the mobile terminal 200 may come into contact with fluid to shorten lifespan or cause a malfunction.

The mobile terminal 200 according to the present disclosure may be provided with a fluid movement port 210, 220 on a surface of the front case 201 to guide moisture flowing into the inside in a predetermined path and discharge the moisture out of the mobile terminal 200 so as to reduce effect on the terminal.

The fluid movement port 210, 220 is disposed such that a groove having a predetermined depth extends in one direction adjacent to a front edge of the front case 201, and configured to guide the movement of fluid flowing into a gap between the display 251 and the front case 201. Here, the fluid means water or moisture flowing into the terminal as the user uses the terminal in daily life, and may be formed in a liquid or spray form.

As shown in FIG. 3, the fluid movement port 210, 220 may include a first fluid movement port 210 and a second fluid movement port 220.

The first fluid movement port 210 is disposed at a position spaced apart from a side end edge of a front surface of the front case 201 by a predetermined distance, and configured to guide the movement of fluid flowing between the display 251 and the front case 201. The first fluid movement port 210 is disposed adjacent to an outer edge of the front case 201 to restrict fluid flowing into the circuit board 281 or electronic device (not shown) located inside the front case 201 from movement.

A surface of the first fluid movement port 210 may be configured to cover a coating member made of a polymer material, thereby efficiently moving fluid along the surface of the first fluid movement port 210. In this case, the coating member may be made of a material having a small surface tension in order to efficiently move fluid.

The first fluid movement port 210 is configured to include a first passage 211 and a first fluid receiving portion 212.

The first passage 211 is disposed adjacent to a side edge of the front case 201 to guide the movement of fluid flowing in from a side portion of the mobile terminal 200, that is, a side end portion of the front case 201.

The first passage 211 may be configured to include an extension portion 211a and a bent portion 211b.

The extension portion 211a may be disposed to extend in an up-down direction along a surface of the front case 201, and fluid flowing into a side gap between the front case 201 and the display 251 may move along the extension portion 211a.

When the user grips the mobile terminal 200 for use, an upper portion of the mobile terminal 200 may be positioned upward, and thus the movement of fluid flowing in along the extension portion 211a extending in an up-down direction may be carried out along a side surface of the front case 201. Part of the fluid moving along the extension portion 211a may be evaporated.

The bent portion 211b may be defined to be bent at a predetermined angle and shape on any one side of the extension portion 211a. The bent portion 211b may be defined in a curved shape while having a predetermined angle, and serves to extend a movement path of fluid moving along the inner side. An angle of the bent portion 211b may be defined to be bent at an angle of 90 degrees or less.

The first fluid receiving portion 212 may be disposed at a lower end portion of the first passage 211 and defined in a groove shape having a predetermined depth on a front surface of the front case 201 to receive fluid moving along the first passage 211. The first fluid receiving portion 212 may be disposed at one end portion of the extension portion 211a to receive fluid moving along the extension portion 211a. The first fluid receiving portion 212 may be defined in a groove shape having a predetermined depth on a surface of the front case 201. Fluid received in the first fluid receiving portion 212 may be discharged to the outside through a structure communicating with a fluid discharge pipe 213 which will be described later.

The second fluid movement port 220 may be disposed at a position spaced apart from a front upper edge of the front case 201 by a predetermined distance, and configured to guide the movement of fluid flowing into a gap between the front case 201 and the display 251.

A surface of the second fluid movement port 220 may be covered with a coating member made of a polymer material to efficiently carry out the movement of fluid along the surface of the second fluid movement port 220.

The second fluid movement port 220 may be configured to include a second passage 221 and a second fluid receiving portion 222.

The second passage 221 may be disposed adjacent to an upper edge of the front case 201 to guide the movement of fluid flowing in from an upper portion of the front case 201. Fluid moving along the second passage 221 may be partially evaporated, and fluid moving by the movement of the terminal may be received in the second fluid receiving portion 222.

The second fluid receiving part 222 may be configured to communicate with the second passage 221 to receive fluid moving along the second passage 221, and defined in a groove shape having a predetermined depth on a surface of the front case 201.

Figure 4A:
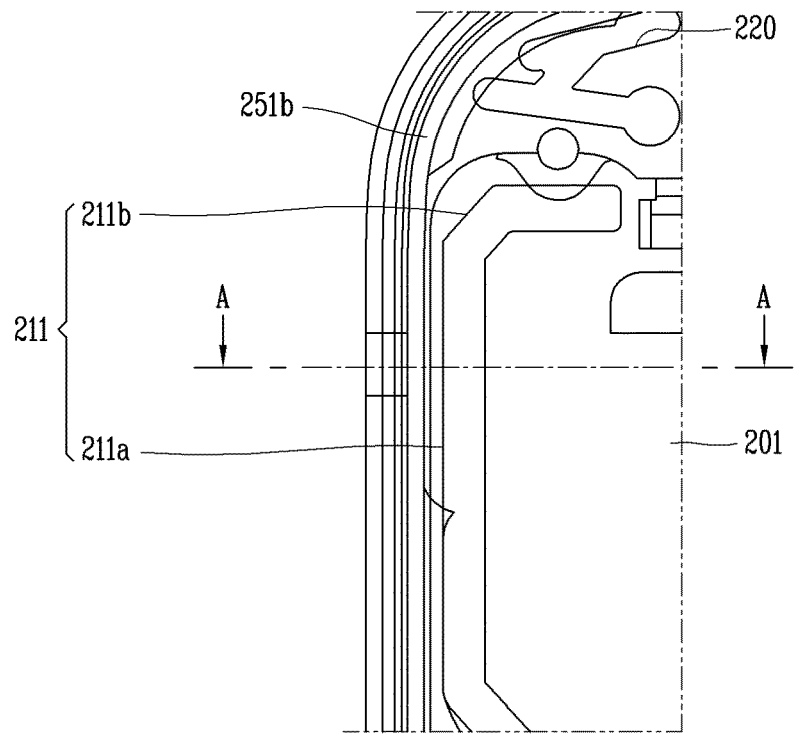
FIG. 4A is a partially enlarged view of a front case disposed with a fluid movement port.
Figure 4B:
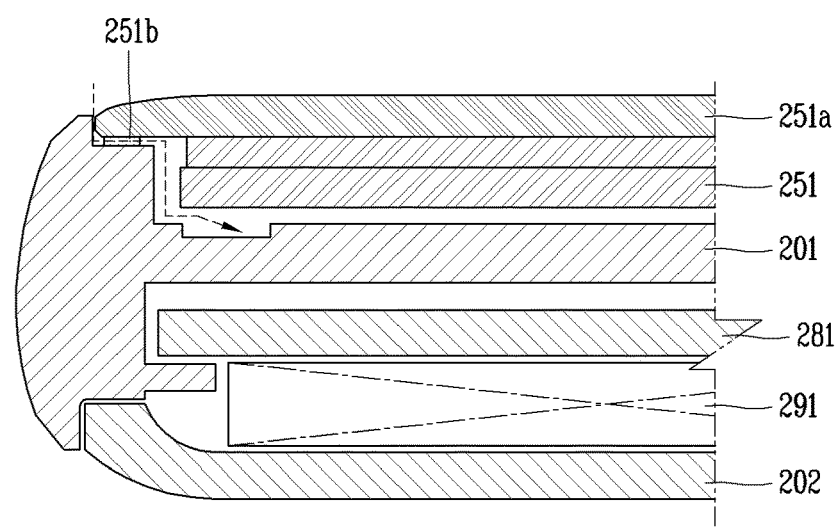
FIG. 4B is a cross-sectional view taken along line A-A of FIG. 4A.

FIG. 4A is a partially enlarged view of the front case 201 disposed with the fluid movement port is formed, and FIG. 4B is a cross-sectional view taken along line A-A of FIG. 4A.

As shown in FIG. 4A, the display 251 with a window attached to the front portion may be located on a front surface of the front case 201, and the window may be coupled in close contact with the front case 201 through the adhesive member 251b. The adhesive member 251b may be located along a front outer circumference of the front case 201, and may be in close contact with the window. In this case, the adhesive member 251b may be preferably made of a material having elasticity, and made of a high elastic material. Despite the adhesive member 251b, fluid may flow into a fine gap between the front case 201 and the window, and the introduced fluid may flow into the first fluid movement port 210 along an arrow direction of FIG. 4B.

The first fluid movement port 210 may be disposed at a position spaced apart from a front side end edge of the front case 201 by a predetermined distance. The first fluid movement port 210 is disposed at a front inner side of the front case 201 other than the position of the adhesive member 251b.

The first fluid movement port 210 may be configured to include a first passage 211 and a first fluid receiving portion 212, and may include the first passage 211 disposed adjacent to a side edge of the front case 201 to guide the up-down movement of fluid flowing toward a side portion of the mobile terminal 200. Here, the side portion of the mobile terminal 200 may denote both left and right sides of the mobile terminal when the user generally grips and operates the mobile terminal.

In addition, the first passage 211 may be configured to include an extension portion 211a extending in an up-down movement and a bent portion 211b disposed to be bent at a predetermined angle at one side of the extension portion 211a.

The extension portion 211a may be disposed to extend in an up-down direction along a surface of the front case 201, and fluid flowing into a side gap between the front case 201 and the display 251 may move along the extension portion 211a.

The bent portion 211b may be defined to be bent at a predetermined angle and shape on any one side of the extension portion 211a. The bent portion 211b may be disposed at a plurality of positions along the extension portion 211a. The bent portion 211b may be disposed at a position capable of avoiding a fastening portion (not shown) to which the front case 201 and the display 251 are coupled.

Here, as shown in FIG. 4A, the bent portion 211b disposed at an upper end of the extension portion 211a may be spaced apart from the second fluid movement port 220 by a predetermined distance to be bent in a direction toward an inside of the front case 201.

Furthermore, according to another embodiment, the bent portion 211b disposed at an upper end of the extension portion 211a may be configured to communicate with one end of the second fluid movement port 220 so as to guide fluid flowing in from an upper portion of the terminal to move along the extension portion 211a.

Figure 5A:
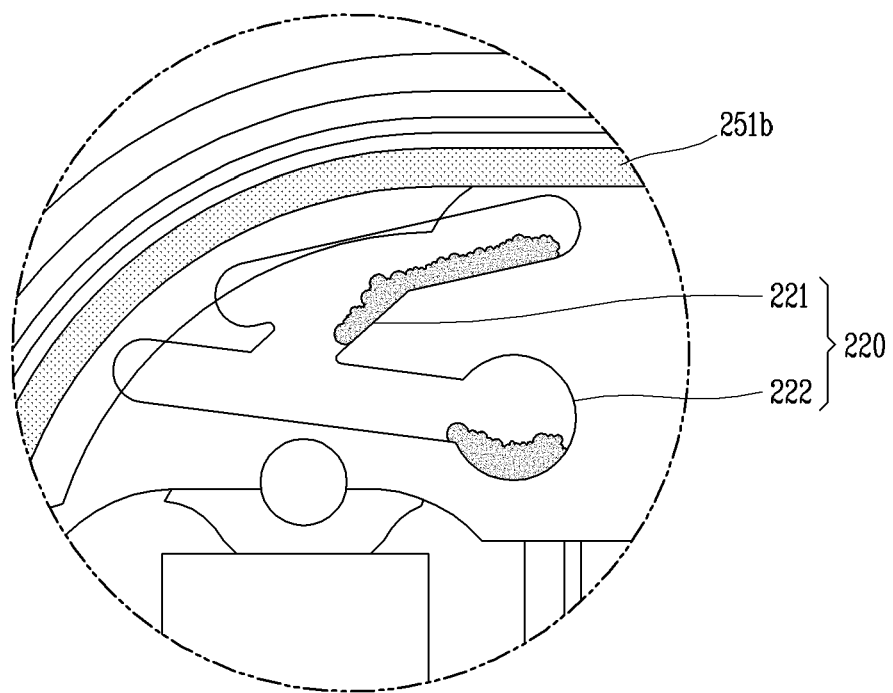
FIG. 5A is an enlarged view showing the shape of a second fluid movement port.
Figure 5B:
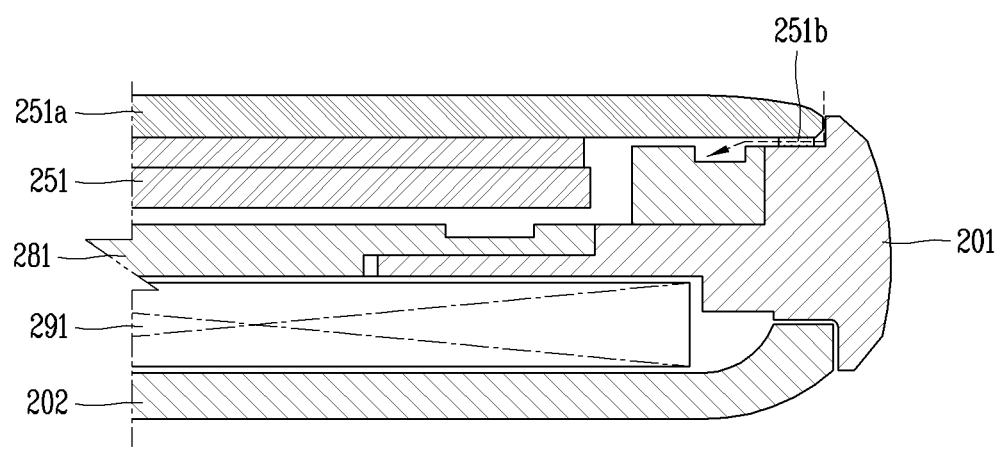
FIG. 5B is a view showing a location where the second fluid movement port is disposed inside the mobile terminal.

FIG. 5A is an enlarged view showing the shape of the second fluid movement port 220, and FIG. 5B is a view showing a location where the second fluid movement port 220 is disposed inside the mobile terminal 200.

The second fluid movement port 220 may be disposed at a position spaced apart from a front upper edge of the front case 201 by a predetermined distance. The second fluid movement port 220 may be divided into a plurality of branches to define a radial pattern. However, the shape of the second fluid movement port 220 may not be limited, and may be defined in a shape that is curved and branched in various directions to increase the movement path of fluid moving along the second fluid movement port using an inner space of the terminal to the maximum.

The second fluid movement port 220 may include a second passage 221 disposed adjacent to an upper edge of the front case 201 to guide the movement of fluid flowing in from an upper portion of the mobile terminal 200, that is, an upper end portion of the front case 201, and a second fluid receiving portion 222 defined in a groove shape having a predetermined depth on a surface of the front case 201 to receive fluid moving along the second passage 221.

As shown in FIG. 5B, fluid may flow into the second passage 221 through an upper portion of the terminal, and through a gap between the window of the display 251 and the front case 201. The second passage 221 may be divided into a plurality of branches, thereby evaporating part of fluid introduced by heat generated from the terminal. Fluid moving along the second passage 221 may be received through the second fluid receiving portion 222 defined in a groove shape having a predetermined depth. The second fluid receiving portion 222 may be radially disposed on a front upper surface of the front case 201.

In other words, the movement of fluid flowing in through an upper portion of the terminal may be guided through the second fluid movement port 220, thereby restricting fluid from moving to the electronic device or circuit board 281 located inside the terminal.

Figure 6A:
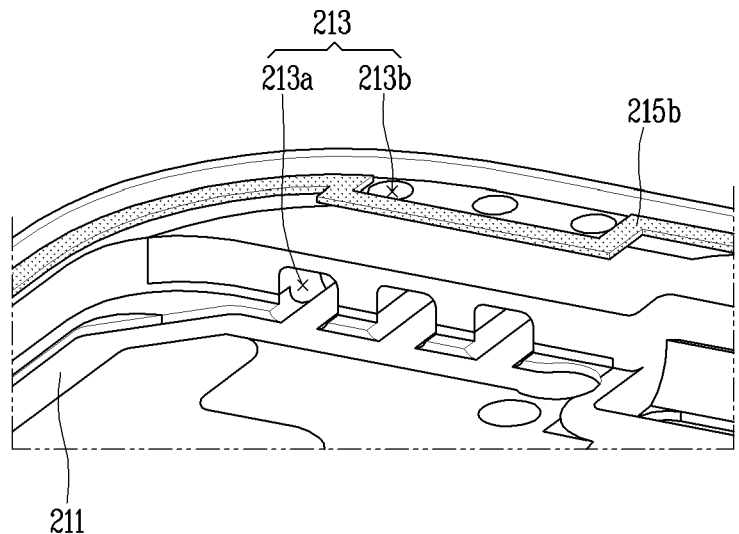
FIG. 6A is an enlarged view of (c) of FIG. 3.
Figure 6B:
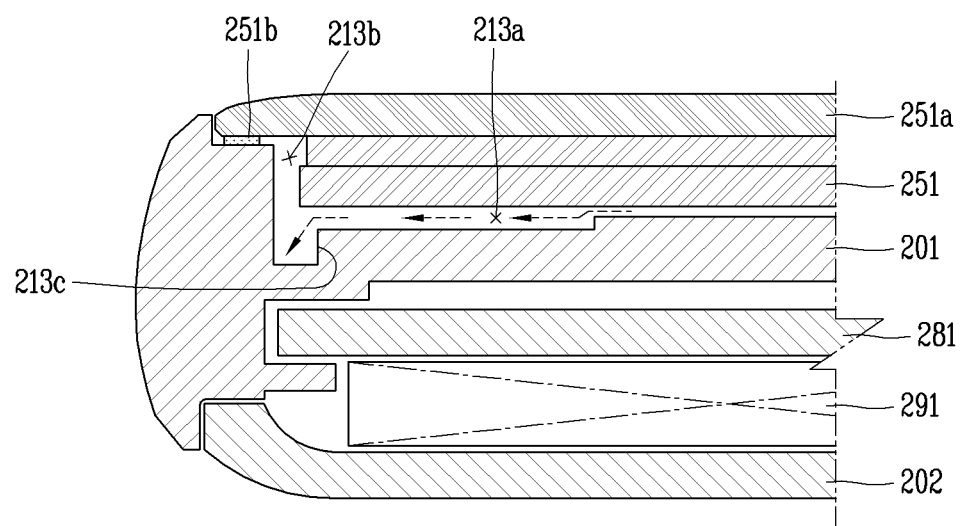
FIG. 6B is a cross-sectional view showing an internal shape of the mobile terminal related to FIG. 6A.

FIG. 6A is an enlarged view of (c) of FIG. 3, and FIG. 6B is a cross-sectional view showing an internal shape of the mobile terminal 200 related to FIG. 6A.

The fluid discharge pipe 213 may be disposed at a lower end portion of the front case 201 to discharge fluid flowing into the terminal. The fluid discharge pipe 213 is configured to communicate with an end portion of the extension portion 211a of the first fluid movement port 210 described above to discharge fluid moving along the first fluid movement port 210 to an outside of the terminal.

The fluid discharge pipe 213 may discharge fluid introduced into the inside through a first hole 213a and a second hole 213b disposed at a portion protruding from a lower end portion of the front case 201. The first hole 213*a* and the second hole 213*b* may be disposed in directions crossing each other.

As shown in FIG. 6B, the first hole 213*a* may be configured to pass through a portion protruding from a lower end portion of the front case 201 in an up-down direction, and the second hole 213*b* may be configured to communicate with the first hole 213*a*, and disposed to pass through in a front-rear direction, which is a direction crossing the first hole 213*a*. A diameter of the first hole 213*a* may be configured to be larger than that of the second hole 213*b*, thereby increasing the efficiency of discharging moisture and limiting the reverse flow of fluid flowing in from the outside. The second hole 213*b* may be disposed outside a position disposed with the adhesive member 251*b*.

In addition, third fluid receiving portion 213*c*, 213*c* may be disposed at a position where the first hole 213*a* and the second hole 213*b* cross each other. The third fluid receiving portion 213*c*, 213*c* may be defined in a groove shape having a predetermined depth on a front surface of the front case 201 so as to receive fluid moving along the first passage 211.

Figure 7:
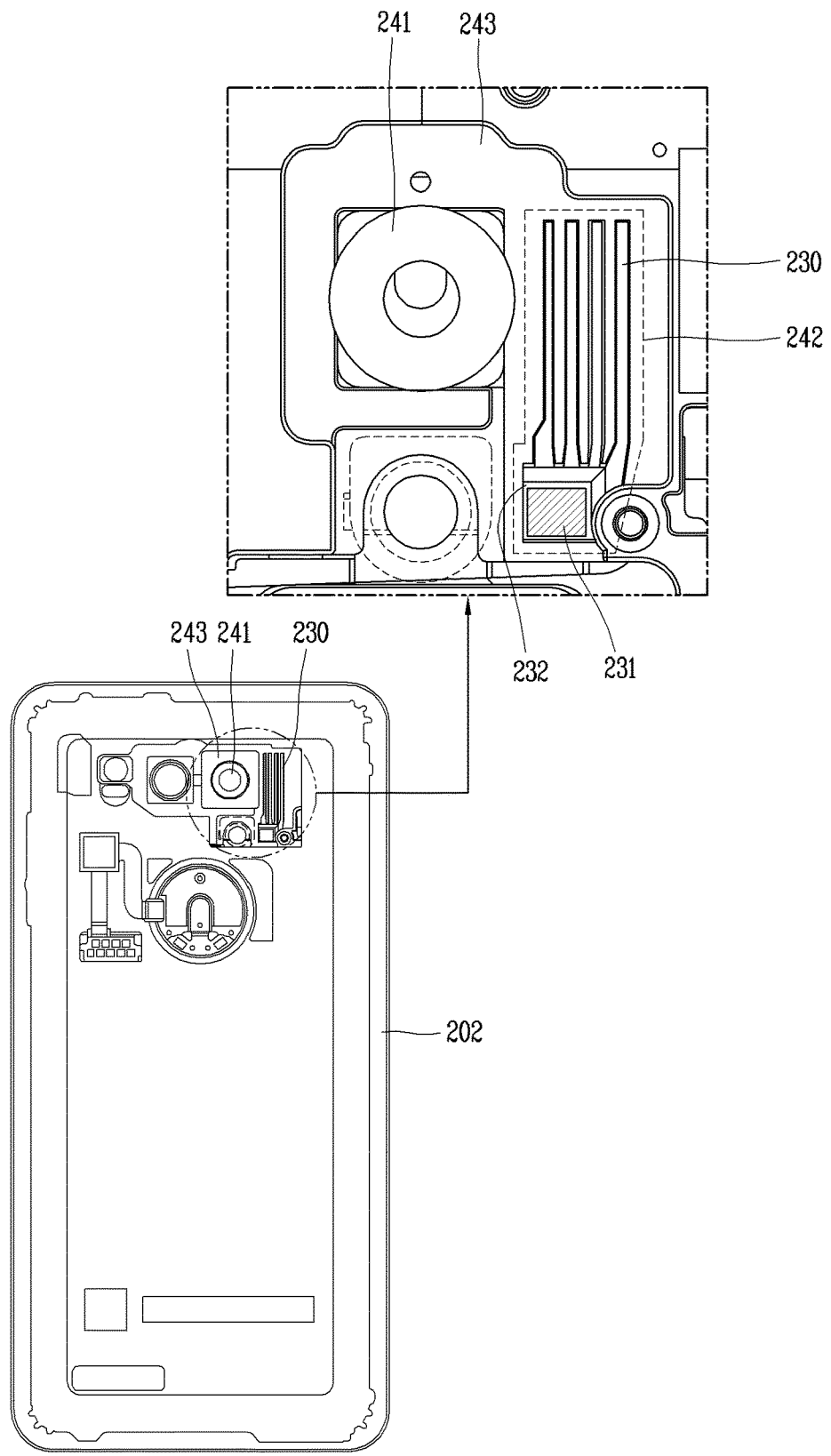
FIG. 7 is a view showing the shape of a rear portion of the front case.
Figure 8A:
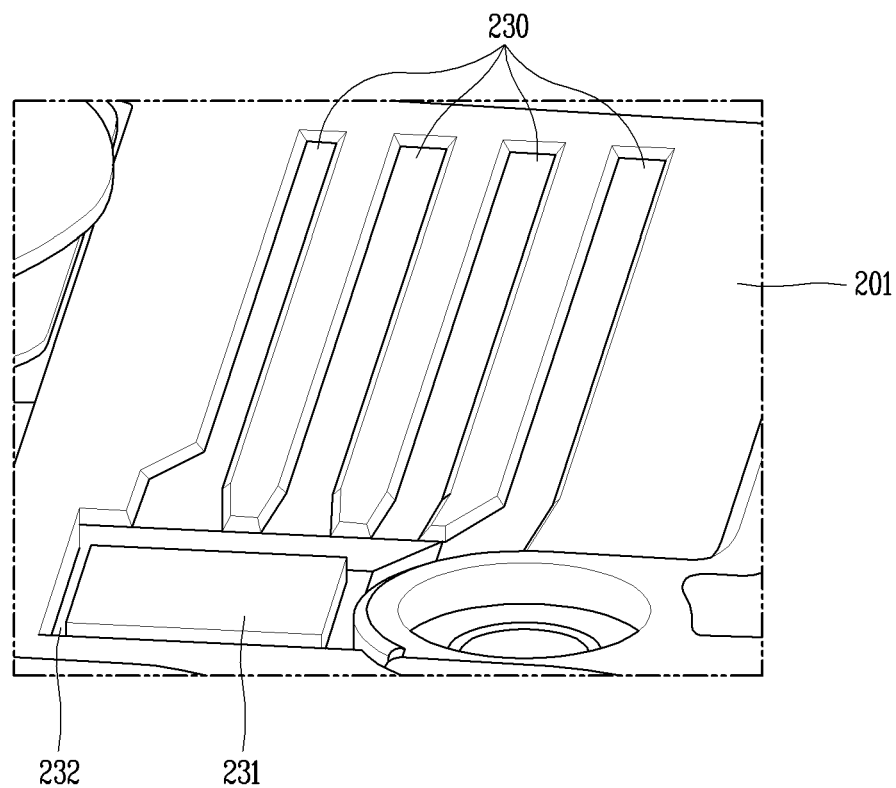
FIG. 8A is an enlarged view showing the shape of a third fluid movement port.
Figure 8B:
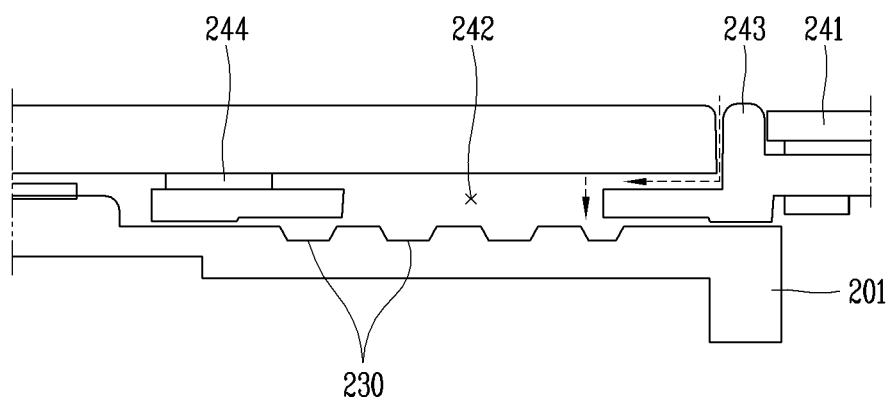
FIG. 8B is a cross-sectional view of the mobile terminal related to FIG. 8A.

FIG. 7 is a view showing the shape of a rear portion of the front case 201. FIG. 8A is an enlarged view showing a shape of the third fluid movement port 230, and FIG. 8B is a cross-sectional view of the mobile terminal 200.

At a rear portion of the front case 201, a camera module 241 and an air vent hole 242 may be disposed in parallel to each other.

The air vent hole 242 may be provided on a rear portion of the front case 201, and disposed adjacent to the camera module 241. As shown in FIG. 7, the camera module 241 and the air vent hole 242 are configured to be covered by a decor plate 243, and to pass through a hole (not shown) disposed in the rear case 202 so as to be exposed to the outside. The air vent hole 242 may be configured to allow air to flow in and out so as to maintain an internal pressure of the mobile terminal 200, and serves to maintain an equilibrium of pressure between the inside and outside of the mobile terminal 200.

The mobile terminal 200 according to the present disclosure may be configured to define the third fluid movement port 230 at a position overlapping with the air vent hole 242. The third fluid movement port 230 may be disposed in an up-down direction to guide the movement of fluid flowing between the camera module 241 and the decor plate 243, and the third fluid movement port 230 has a plurality of branch passages. The third fluid movement port 230 may be disposed to have an inclination of a predetermined angle to efficiently induce the fluid movement through water repellent and coating treatment on the surface. A material made of a polymer material may be formed on a surface of the third fluid movement port 230 to cover the surface.

The third fluid movement port 230 may be disposed at a rear portion of the front case 201, and disposed at a position overlapping with the air vent hole 242.

Furthermore, an absorbent member 231 may be provided at one end portion of the third fluid movement port 230 to absorb fluid moving along the third fluid movement port 230. The absorbent member 231 may be located at an absorbent member seating groove 232 disposed to be recessed at a rear portion of the front case 201. The absorbent member 231 may be made of a material capable of efficiently absorbing moisture to absorb fluid moving along the third fluid movement port 230, and then to induce evaporation.

The foregoing embodiments are merely exemplary and are not to be considered as limiting the present disclosure. The scope of the invention should be determined by reasonable interpretation of the appended claims and all changes that come within the equivalent scope of the invention are included in the scope of the invention.

The present disclosure may be applied and used in various ways in an industrial field that produces a mobile terminal.

What is claimed is:

1. A mobile terminal, comprising:
   a front case on which a display is mounted on a front side thereof;
   a rear case coupled to a rear portion of the front case;
   a main circuit board provided between the front case and the rear case; and
   a fluid movement port in which a groove extends in one direction is disposed adjacent to a front edge of the front case,
   wherein the fluid movement port guides the movement of fluid flowing into a gap between the display and the front case,
   wherein the fluid movement port comprises:
   a first fluid movement port disposed at a position spaced apart from a front side end edge of the front case; and
   a second fluid movement port disposed at a position spaced apart from a front upper edge of the front case.

2. The mobile terminal of claim 1, wherein a coating member made of a polymer material is configured to cover a surface of each of the first and second fluid movement ports.

3. The mobile terminal of claim 1, wherein the first fluid movement port comprises:
   a first passage disposed adjacent to a side edge of the front case to guide the movement of fluid flowing in from a side portion of the front case; and
   a first fluid receiving portion disposed at a lower end portion of the first passage and defined in a groove shape having a predetermined depth on a front surface of the front case to receive fluid moving along the first passage.

4. The mobile terminal of claim 3, wherein the first passage comprises an extension portion configured to extend in an up-down direction along a surface of the front case so as to guide the movement of the fluid.

5. The mobile terminal of claim 4, wherein a bent portion is disposed at one side of the extension portion so as to be bent at a predetermined angle and shape.

6. The mobile terminal of claim 5, wherein the bent portions are disposed at a plurality of positions along the extension portion.

7. The mobile terminal of claim 4, wherein a fluid discharge pipe connected to the extension portion is disposed at a lower end portion of the front case, and the fluid discharge pipe guides the discharge of fluid moving along the extension portion.

8. The mobile terminal of claim 1, wherein the second fluid movement port comprises:
   a second passage disposed adjacent to an upper edge of the front case to guide the movement of fluid flowing in from an upper portion of the front case; and
   a second fluid receiving portion defined in a groove shape having a predetermined depth on a surface of the front case to receive fluid moving along the second passage.

9. The mobile terminal of claim 8, wherein the second fluid receiving portion is radially disposed on a front upper surface of the front case.

10. A mobile terminal, comprising:
    a front case on which a display is mounted on a front side thereof;

a rear case coupled to a rear portion of the front case;
a main circuit board provided between the front case and the rear case;
a fluid movement port in which a groove extends in one direction is disposed adjacent to a front edge of the front case;
an air vent hole disposed adjacent to a camera module to allow air to flow in and out so as to maintain pressure inside the mobile terminal at a rear portion of the front case;
a decor plate configured to cover the camera module and the air vent hole; and
another fluid movement port extending in an up-down direction at a position overlapping with the air vent hole to guide the movement of fluid flowing in between the camera module and the decor plate.

11. The mobile terminal of claim 10, wherein an absorbent member is provided at one end portion of the third fluid movement port to absorb fluid moving along the third fluid movement port.

\* \* \* \* \*